(12) United States Patent
Inaba et al.

(10) Patent No.: US 8,993,071 B2
(45) Date of Patent: Mar. 31, 2015

(54) METHOD FOR MANUFACTURING MAGNETIC RECORDING MEDIUM

(75) Inventors: Hiroshi Inaba, Kanagawa (JP); Hiroshi Kanai, Kanagawa-ken (JP); Nobuto Yasui, Kanagawa (JP); Toshinori Ono, Tokyo (JP)

(73) Assignee: HGST Netherlands B.V., Amsterdam (NL)

( * ) Notice: Subject to any disclaimer, the term of this patent is extended or adjusted under 35 U.S.C. 154(b) by 1780 days.

(21) Appl. No.: 12/288,538

(22) Filed: Oct. 20, 2008

(65) Prior Publication Data

US 2009/0123660 A1  May 14, 2009

(30) Foreign Application Priority Data

Nov. 8, 2007 (JP) ................. 2007-290641

(51) Int. Cl.
  *G11B 5/855* (2006.01)
  *C23C 14/04* (2006.01)
  *C23C 14/16* (2006.01)
  *C23C 14/46* (2006.01)
  *C23C 14/06* (2006.01)

(52) U.S. Cl.
  CPC .............. *G11B 5/855* (2013.01); *C23C 14/048* (2013.01); *C23C 14/16* (2013.01); *C23C 14/0605* (2013.01); *C23C 14/46* (2013.01); *C23C 14/042* (2013.01)
  USPC ............ 427/535; 427/552; 427/128; 427/130

(58) Field of Classification Search
  USPC .................. 427/535, 598, 599; 360/131, 135
  See application file for complete search history.

(56) References Cited

U.S. PATENT DOCUMENTS

| | | | |
|---|---|---|---|
| 5,476,691 A * | 12/1995 | Komvopoulos et al. | ...... 427/527 |
| 6,055,139 A * | 4/2000 | Ohtsuka et al. | ............... 360/131 |
| 7,067,207 B2 | 6/2006 | Kamata et al. | |
| 2004/0191577 A1* | 9/2004 | Suwa et al. | ............. 428/694 TP |
| 2005/0153169 A1* | 7/2005 | Watanabe et al. | ...... 428/694 BM |

FOREIGN PATENT DOCUMENTS

| | | |
|---|---|---|
| JP | 2002-288813 | 10/2002 |
| JP | 2004-164692 | 6/2004 |

\* cited by examiner

*Primary Examiner* — Dah-Wei D Yuan
*Assistant Examiner* — Jose Hernandez-Diaz
(74) *Attorney, Agent, or Firm* — Zilka-Kotab, PC

(57) ABSTRACT

Embodiments of the present invention provide a manufacturing method that can form a track guide separation area of a magnetic disk substrate constituting a patterned medium represented by a discrete track medium or bit patterned medium suitable for high recording density, uniformly on the whole surface of the magnetic disk substrate, and accurately according to the mask. According to one embodiment, a soft magnetic film, an under coating film, and a magnetic film are formed on a substrate. A mask having an arbitrary pattern shape provided for forming the track guide separation area in the magnetic film is formed on the magnetic film, and the track guide separation area is formed by irradiating ions and electrons onto the surface of the magnetic film and applying an intermittent voltage to the substrate, thereby non-magnetizing the area irradiated.

9 Claims, 12 Drawing Sheets

METHOD FOR MANUFACTURING MAGNETIC RECORDING MEDIUM

CROSS-REFERENCE TO RELATED APPLICATION

The instant nonprovisional patent application claims priority to Japanese Patent Application No. 2007-290641 filed Nov. 8, 2007 and which is incorporated by reference in its entirety herein for all purposes.

BACKGROUND OF THE INVENTION

In recent years, denser storage capacity and higher performance have grown in hard disk drives because of the increase in the volume of information used on personal computers and the expansion of applications to video recording devices, car navigation systems, and so on. The adoption of a perpendicular magnetic recording medium that achieves stable read output without thermal fluctuation in a high recording density area and a tunneling magnetoresistance head greatly contributes to the background. In the perpendicular magnetic recording medium, small unit magnets arrayed vertically on a magnetic recording medium surface are structured to be separated in advance by a non-magnetic material contained in a magnetic film.

Currently, as a proposal to control this separation area more actively and improve the magnetic recording density, a discrete track medium on which separation processing is done between disk tracks, as described in Japanese Patent Publication No. 2004-164692 ("Patent Reference 1"), and a bit patterned medium on which separation processing is done also in the direction of recording bits have been researched and developed. In both cases, the technique of forming and processing the separation area is a key point of high recording density. For example, for the discrete track medium, a substrate processing method in which grooves and lands are formed concentrically on the substrate in advance and a magnetic film is formed thereon, and a magnetic film processing method in which a magnetic film is masked and a part to be grooved is etched, thereby forming grooves and lands, have been proposed as techniques of forming and processing the separation area. However, since these techniques have many process steps of refilling the grooves with a non-magnetic material, then flattening its surface to the height of the magnetic film to be the lands, and forming a protection film on the flattened surface, additional problems arise such as an increase of particles generated on the surface of the magnetic film and the protection film, and an increase in surface roughness. This obstructs the narrowing of spacing (nano-spacing) between the magnetic head and the magnetic disk surface, which is another point for high recording density.

As a measure to solve these issues, a method that achieves magnetically the same effect as grooves and lands has been tried, instead of forming grooves and lands in terms of shape. This is an ion beam processing method in which a conventionally formed magnetic film is masked and ion implantation is carried out to a part to be grooved by using ion beams, thereby forming a non-magnetized area, as described in Japanese Patent Publication No. 2002-288813 ("Patent Reference 2"). As this technique is used, it is not necessary to later refill the grooves with a non-magnetic material and the flattening of its surface is not necessary, either. It is considered that good flying characteristics and magnetic characteristics as a magnetic recording medium are provided.

The problem to be solved by the present invention is associated with the ion beam processing method, which is one of the conventional techniques. That is, as made clear in an experiment by the inventors, it has been found that in the case where only ion implantation with ion beams is carried out, production of a uniform non-magnetic area over the surface of a magnetic disk substrate to be processed, and production of an accurate non-magnetic area according to the mask dimension are imperfect, and that local breakdown of the magnetic film is caused in the worst case.

For example, in the case where the substrate surface is irradiated with ion beams having general positive charges, the substrate itself gets easily charged up when the substrate is electrically floating. In this case, the substrate gets charged up with a voltage equivalent to the acceleration voltage of the ions, and ion implantation itself becomes difficult. Also, even when the substrate is electrically grounded, a local charged-up area is generated on the outermost surface of the substrate. Again, as a part where generation of ion implantation is difficult, ion implantation becomes non-uniform on the substrate surface as a whole. Particularly, if local charge-up occurs in an unmasked ion implantation area for the purpose of non-magnetization, the direction of ion implantation changes and ion implantation into other areas than the required non-magnetization area occurs. Thus, the mask pattern cannot be accurately transferred.

Also, usually, a disk substrate is held in point contact at several points in a deposition apparatus in most cases. Incident ions easily concentrate at these point-contact parts having an acute-angled shape, and the disk substrate including a magnetic medium may be broken because of the concentration of an electric field. This phenomenon occurs more conspicuously in the case where a base substrate of a non-conductive material, for example, glass and so on, is used. It is considered that this is because, while a conductive material such as a magnetic material is usually formed on a glass substrate, the thickness of its film is about a few ten to a few hundred nanometers and a sufficient current route sectional area cannot be secured in the direction of the film thickness.

BRIEF SUMMARY OF THE INVENTION

Embodiments of the present invention provide a manufacturing method that can form a track guide separation area of a magnetic disk substrate constituting a patterned medium represented by a discrete track medium or bit patterned medium suitable for high recording density, uniformly on the whole surface of the magnetic disk substrate, and accurately according to the mask. According to the embodiment of FIGS. 1(a)-1(d), a soft magnetic film 12, an under coating film 13, and a magnetic film 14 are formed on a substrate 11. A mask 18 having an arbitrary pattern shape provided for forming the track guide separation area in the magnetic film 14 is formed on the magnetic film 14, and the track guide separation area 19 is formed by irradiating ions 15 and electrons 16 onto the surface of the magnetic film and applying an intermittent voltage to the substrate 11, thereby non-magnetizing the area irradiated.

DETAILED DESCRIPTION OF THE INVENTION

Embodiments of the present invention relate to a method for manufacturing a patterned medium represented by a discrete track medium or bit patterned medium suitable for high recording density, and particularly a method for forming a track guide separation area.

It is an object of embodiments of the present invention to enable production of a uniform non-magnetic area in a magnetic film and production of an accurate non-magnetic area according to the mask dimension, over the surface of the magnetic recording medium.

To achieve the above object, a method for manufacturing a magnetic recording medium according to embodiments of the present invention includes: a step of forming at least a magnetic film on a top part of a substrate; a step of forming, on the magnetic film, a mask having a pattern to form a non-magnetic area in the magnetic film; a step of irradiating the magnetic film having the mask formed thereon with ions and electrons and applying an intermittent voltage to the substrate, thereby non-magnetizing an area of the magnetic film irradiated with ions and electrons; and a step of removing the mask.

A plasma beam may be used to irradiate the magnetic film with ions and electrons. Also, to irradiate the magnetic film with ions and electrons, plasma is generated by arc discharge of a negative electrode having metal as its principal component, and the generated plasma is carried by a curved magnetic duct and thus supplied to the substrate. Alternatively, an ion beam source and an electron supply source may be used simultaneously to irradiate the magnetic film with ions and electrons. A high-voltage pulse power supply may be used to apply an intermittent voltage to the substrate. As an output voltage of the high-voltage pulse power supply is adjusted to −5 to −50 kV, the depth of the non-magnetized area formed in the magnetic film can be adjusted. The ions may be chromium ions, manganese ions or vanadium ions, and the mask may be a metal thin film. Furthermore, a soft magnetic film and an undercoat film may be formed between the substrate and the magnetic film.

The non-magnetized area can be formed in the magnetic film by carrying out the step of forming the non-magnetized area in the magnetic film after forming a protection film on the magnetic film and forming a mask on the protection film, and then by irradiating ions and electrons from above the protection film having the mask formed thereon.

According to embodiments of the present invention, it is possible to produce a uniform non-magnetic area over the surface of the magnetic recording medium and to produce an accurate non-magnetized area according to the mask dimension. A patterned medium suitable for high recording density can be efficiently formed.

Figure 9:
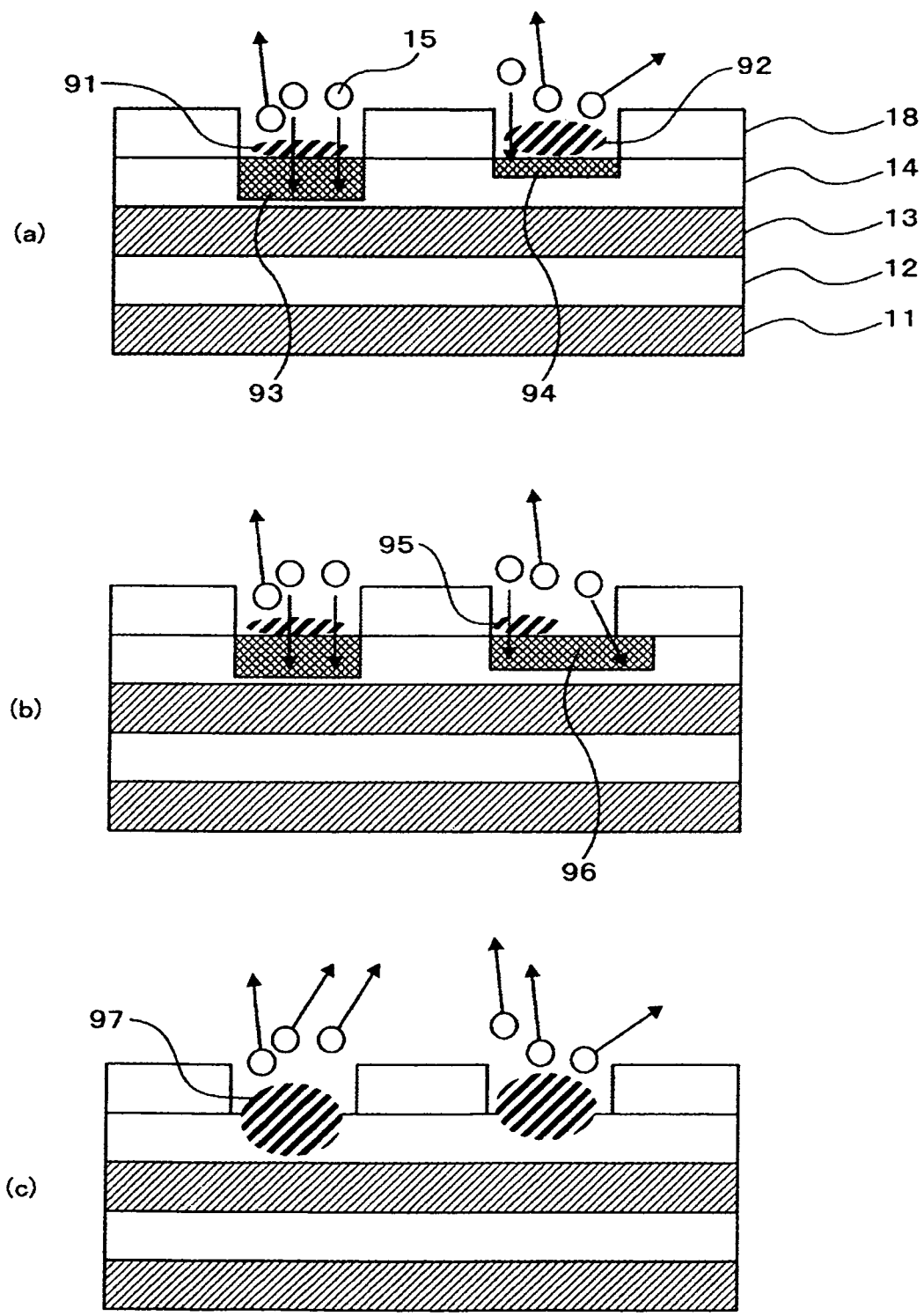
FIGS. 9(a)-9(c) are conceptual views showing a problem generated in a case where a track guide separation area is formed by using a conventional ion beam.

First, referring to FIGS. 9(a)-9(c), a problem with the formation of a non-magnetized area (non-magnetic part) using ion beams will be described. A magnetic disk substrate is formed by a soft magnetic film 12, an undercoat film 13 and a magnetic film 14 stacked on a glass substrate 11. In the case where a mask 18 is formed on the magnetic film 14 and ion beams 15 are irradiated in order to form a non-magnetic part in the magnetic film 14, local charge-up occurs. FIG. 9(a) shows a conceptual view of a case where different ion implantation depth areas (area 93 and area 94) are generated, influenced by different charged-up areas (area 91 and area 92) that are generated depending on the processing position. FIG. 9(b) shows a conceptual view of a case where the incident direction of implanted ions is changed by a charged-up area 95 that is locally generated in a similar manner, and a deviated non-magnetized area 96 is thus generated. FIG. 9(c) shows a conceptual view in which the magnetic film 14 itself is locally charged up (area 97), where arcing is generated and breaks the magnetic film.

A characteristic of embodiments of the present invention is that, in order to solve the problem as described above, the magnetic film is irradiated with a plasma beam, thus forming a non-magnetic part in the magnetic film. Hereinafter, embodiments of the present invention will be described with reference to the drawings.

Figure 2:
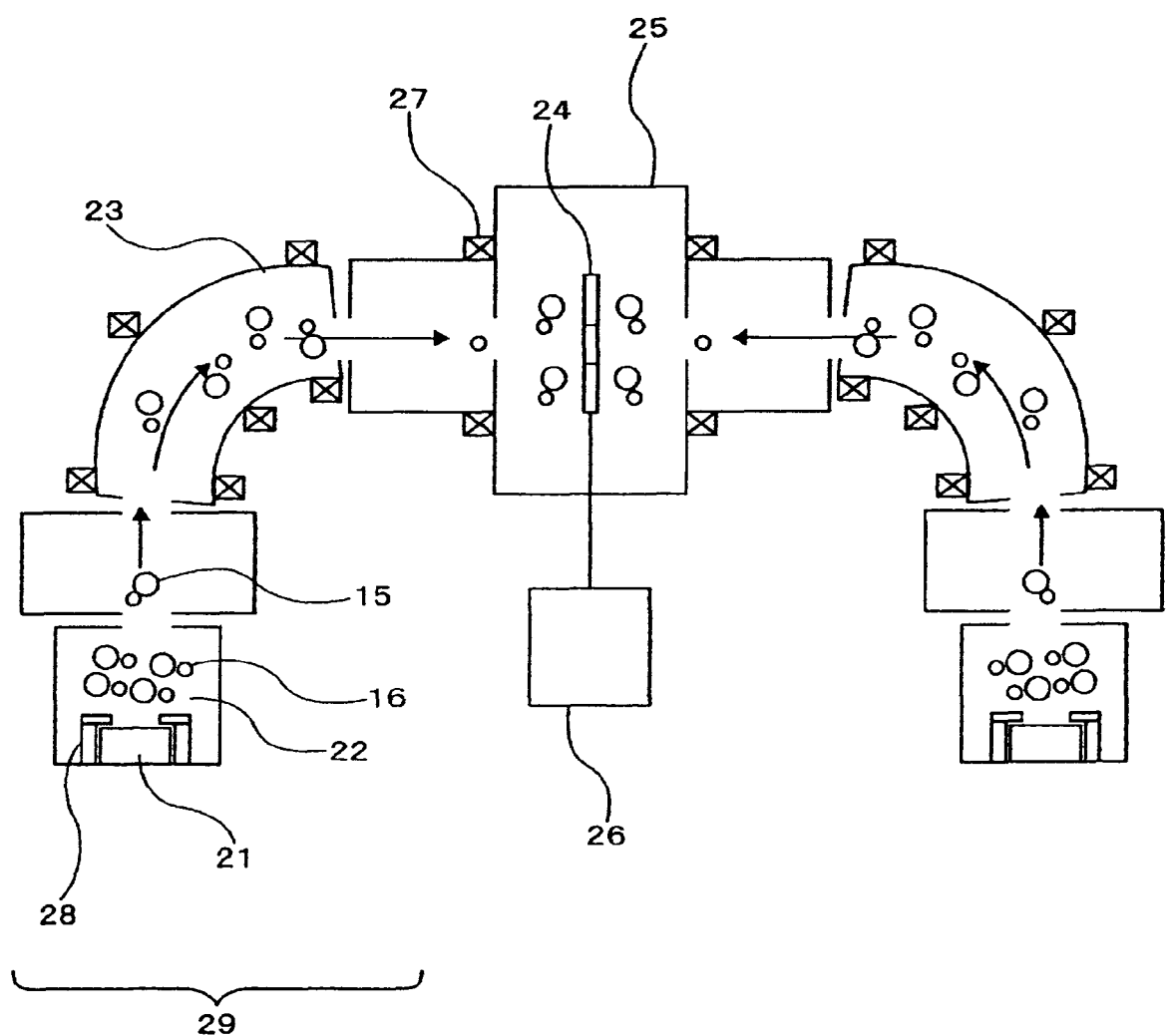
FIG. 2 is a schematic diagram of a vacuum processing apparatus that realizes the production process of Example 1.
Figure 3:
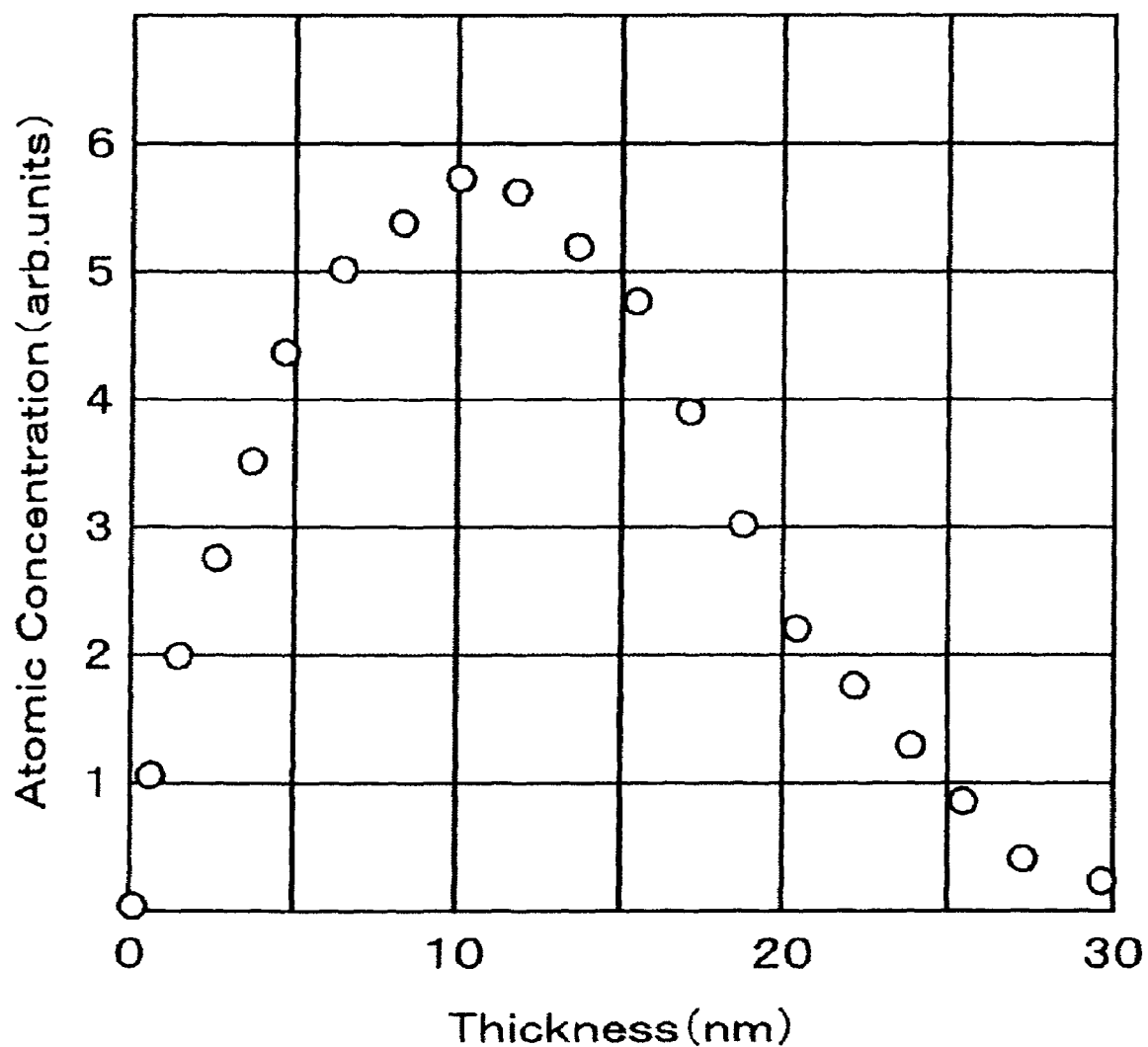
FIG. 3 is a graph showing the results of carrying out depth analysis of a non-magnetized area in the magnetic disk substrate produced according to Example 1, by using a micro-Auger electron spectroscopy.
Figure 4:
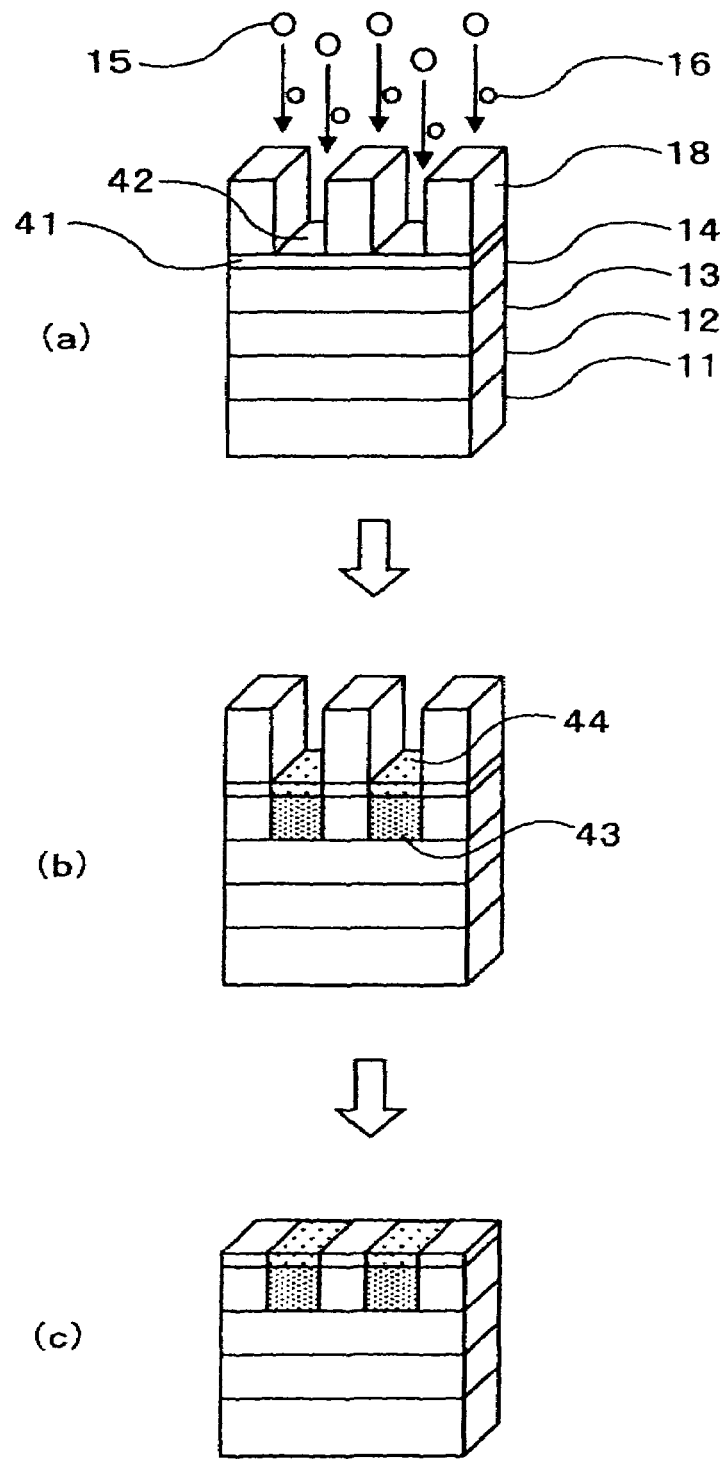
FIGS. 4(a)-4(c) are diagrams of a production process for a magnetic recording medium according to Example 2.
Figure 5:
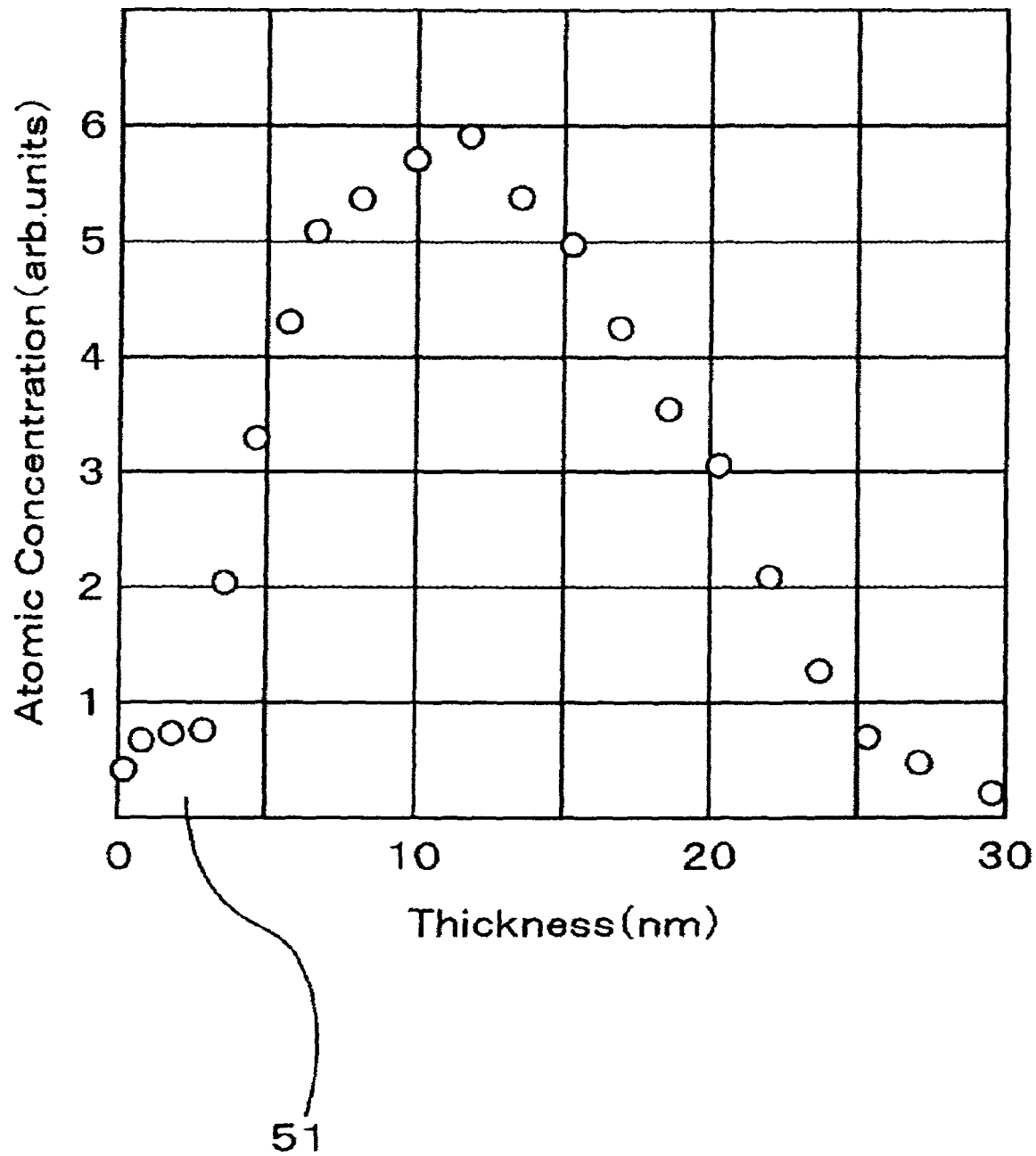
FIG. 5 is a graph showing the results of carrying out depth analysis of a non-magnetized area in the magnetic disk substrate produced according to Example 2, by using a micro-Auger electron spectroscopy.
Figure 6:
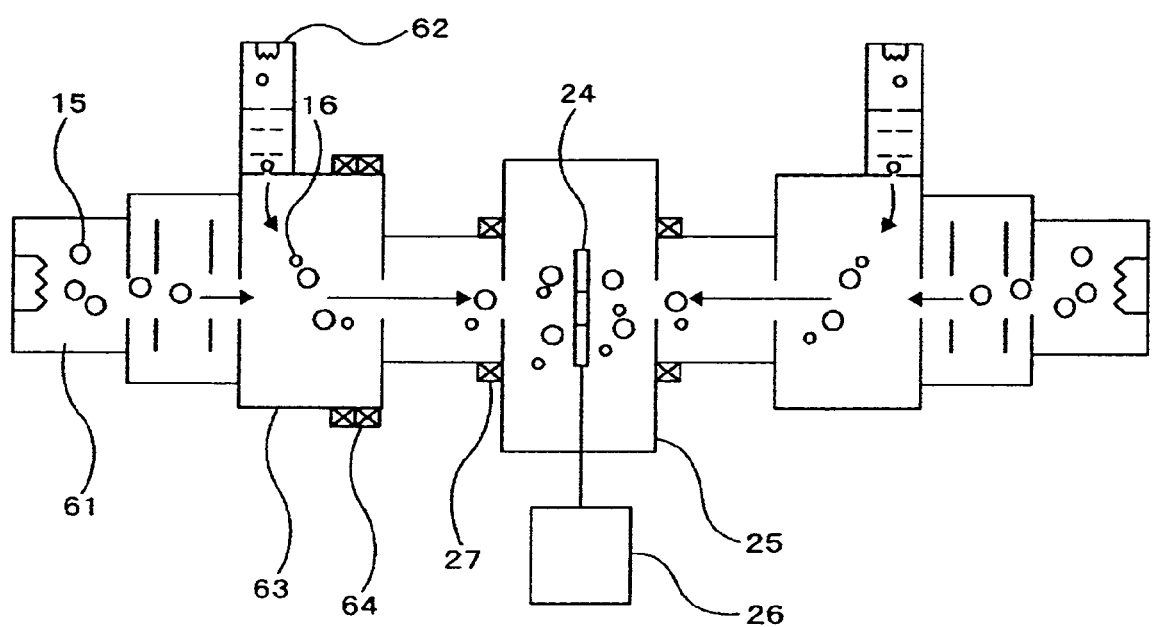
FIG. 6 is a schematic diagram of a vacuum processing apparatus that realizes a production process of Example 3.
Figure 7:
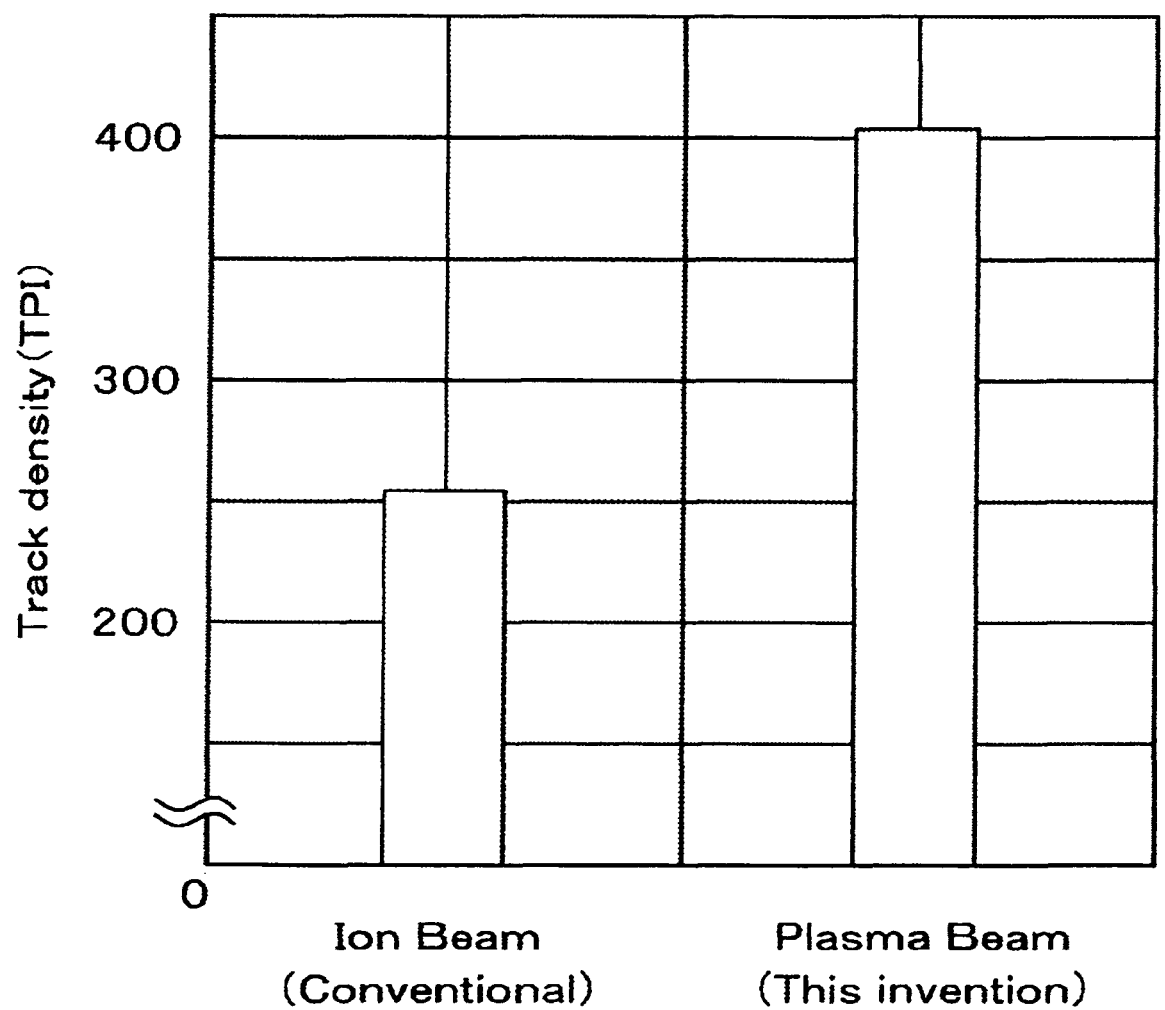
FIG. 7 is a graph showing the results of comparative evaluation of average track density between a discrete track medium provided by ion implantation formed by an ion beam, which is a conventional technique, and a discrete track medium provided by ion implantation formed by a plasma beam, which is in accordance with an embodiment of the present invention.
Figure 8:
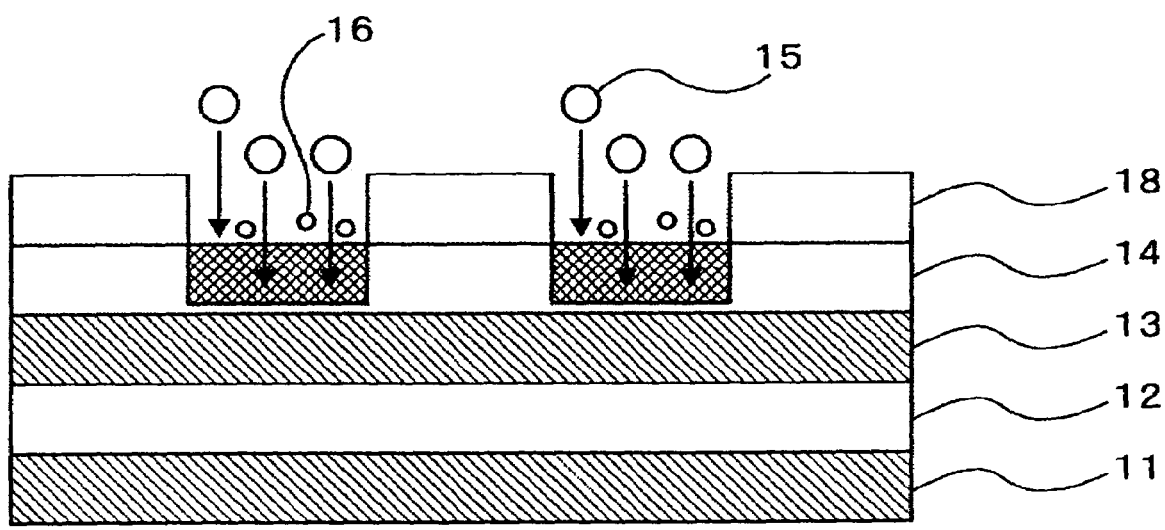
FIG. 8 is a conceptual view of a case where a track guide separation area is formed by using a plasma beam according to an embodiment of the present invention.
Figure 10:
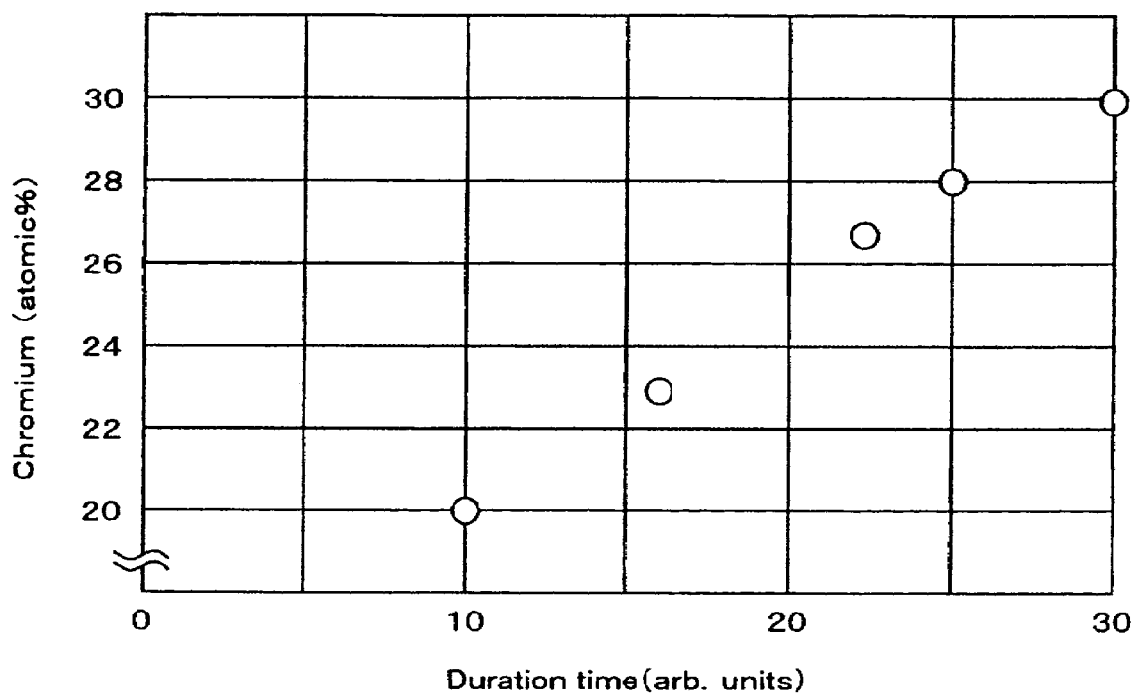
FIG. 10 is a graph showing the chromium atom percentage in a non-magnetized area with respect to processing time in a case where non-magnetization is carried out by using a plasma beam according to an embodiment of the present invention.
Figure 11:
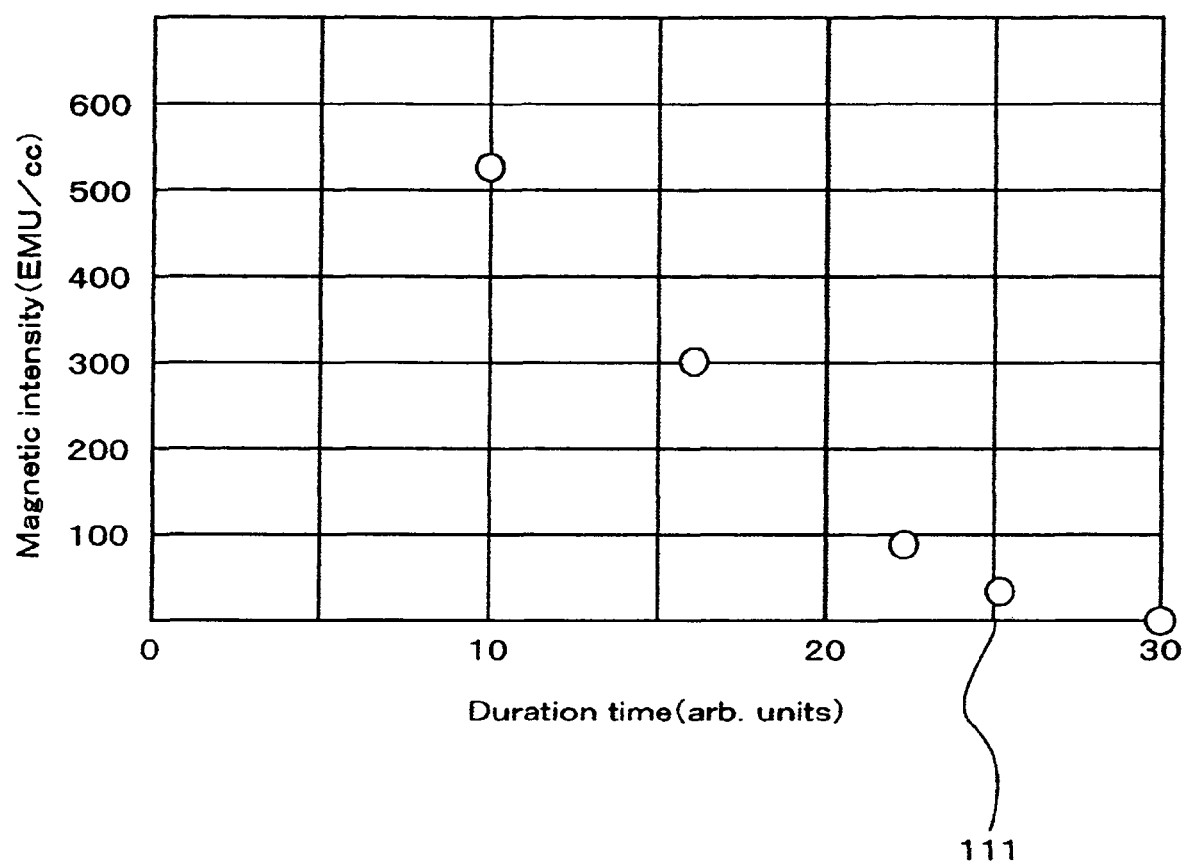
FIG. 11 is a graph showing the intensity of magnetization of a non-magnetized area with respect to processing time in a case where non-magnetization is carried out by using a plasma beam according to an embodiment of the present invention.
Figure 12:
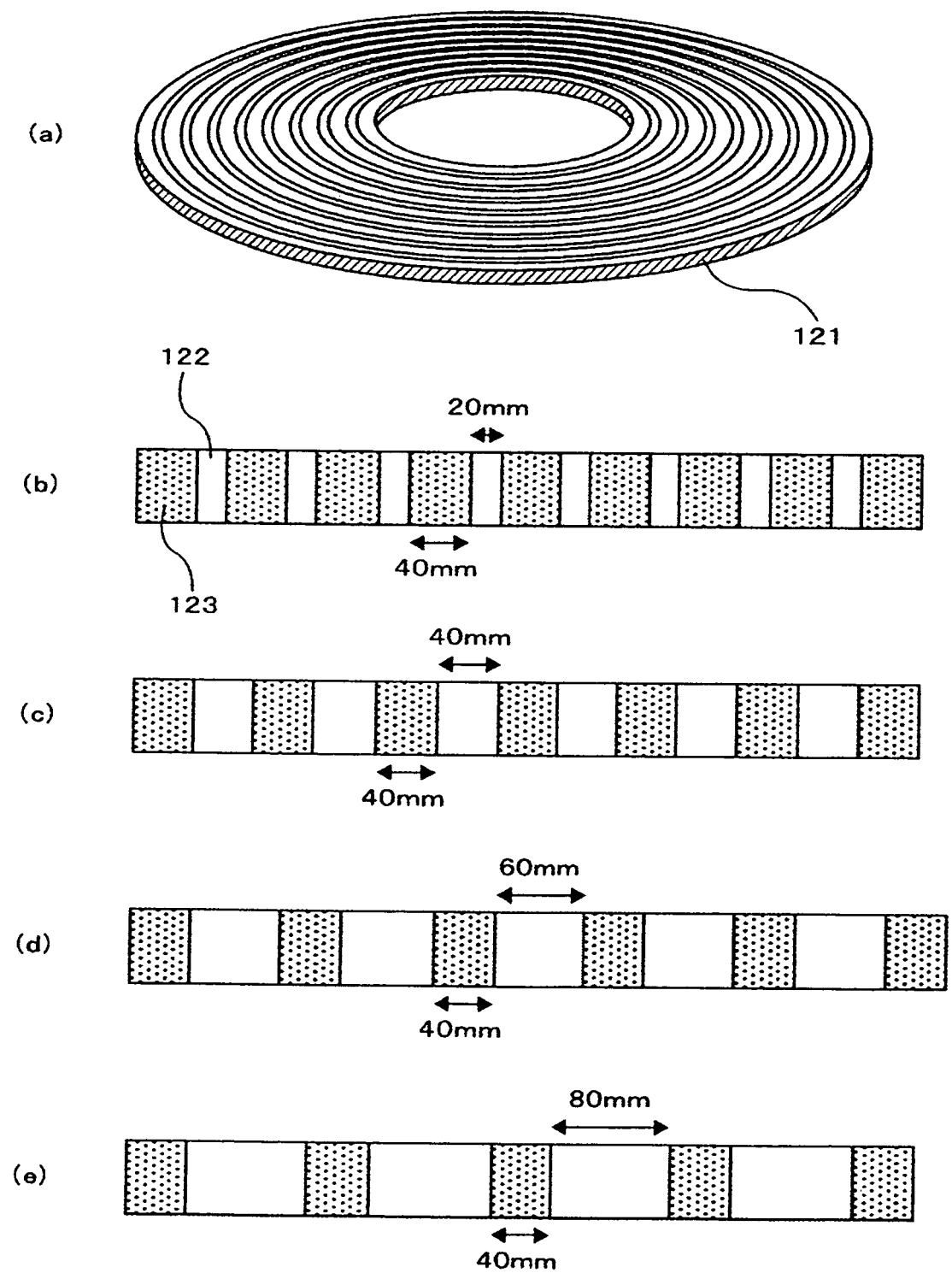
FIGS. 12(a)-12(e) are conceptual views of a discrete track medium and a sectional conceptual view of a metal thin film mask.

FIGS. 1(a)-1(d) are diagrams of a production process according to Example 1 in order to produce a magnetic recording medium having a track guide separation area (non-magnetic area) from a magnetic disk substrate including a glass substrate, a soft magnetic film, an undercoat film and a magnetic film, by using a plasma beam. FIG. 2 is a schematic diagram of a vacuum processing apparatus that realizes the production process of Example 1 and in which a plasma beam generated by using arc discharge is simultaneously irradiated onto both sides of a magnetic disk substrate and a high-voltage pulse can be applied to the magnetic disk substrate. FIG. 3 is a graph showing the results of forming a non-magnetized area in a magnetic disk substrate including a glass substrate, a soft magnetic film, an undercoat film and a magnetic film by the production process of Example 1 and then carrying out depth analysis of that part by using micro-Auger electron spectroscopy. FIGS. 4(a)-4(c) are diagrams of a production process according to Example 2 in order to produce a magnetic recording medium having a track guide separation area (non-magnetic area) from a magnetic disk substrate including a glass substrate, a soft magnetic film, an undercoat film, a magnetic film and a protection film, by using a plasma beam. FIG. 5 is a graph showing the results of forming a non-magnetized area in a magnetic disk substrate including a glass substrate, a soft magnetic film, an undercoat film, a magnetic film and a protection film by the production process of Example 2 and then carrying out depth analysis of that part by using micro-Auger electron spectroscopy. FIG. 6 is a schematic diagram of a vacuum processing apparatus that realizes a production process according to Example 3 and in which a plasma beam is generated by using both an ion beam source and an electron supply source and simultaneously irradiated onto both sides of a magnetic disk substrate and a high-voltage pulse can be applied to the magnetic disk substrate. FIG. 7 is a graph showing the results of comparative evaluation of average track density between a discrete track medium provided by ion implantation formed by an ion beam, which is a conventional technique, and a discrete track medium provided by ion implantation formed by a plasma beam, which is in accordance with an embodiment of the present invention. FIG. 8 is a conceptual view of a case where a magnetic disk substrate including a glass substrate, a soft magnetic film, an undercoat film and a magnetic film is non-magnetized by using a plasma beam according to an embodiment the present invention, and a track guide separation area is formed therein. FIG. 10 is a graph showing the chromium atom percentage in a non-magnetized area with respect to processing time in a case where a magnetic disk substrate including a glass substrate, a soft magnetic film, an undercoat film, a magnetic film and a protection film is non-magnetized by using a plasma beam according to embodiments of the present invention. FIG. 11 is a graph showing the relation between processing time of non-magnetization using a plasma beam according to an embodiment of the present invention and the intensity of magnetization in a non-magnetized area in a magnetic disk substrate including a glass substrate, a soft magnetic film, an undercoat film, a magnetic film and a protection film. FIG. 12 is a conceptual view of a discrete track medium and a sectional conceptual view of a metal thin film mask.

Example 1

Figure 1:
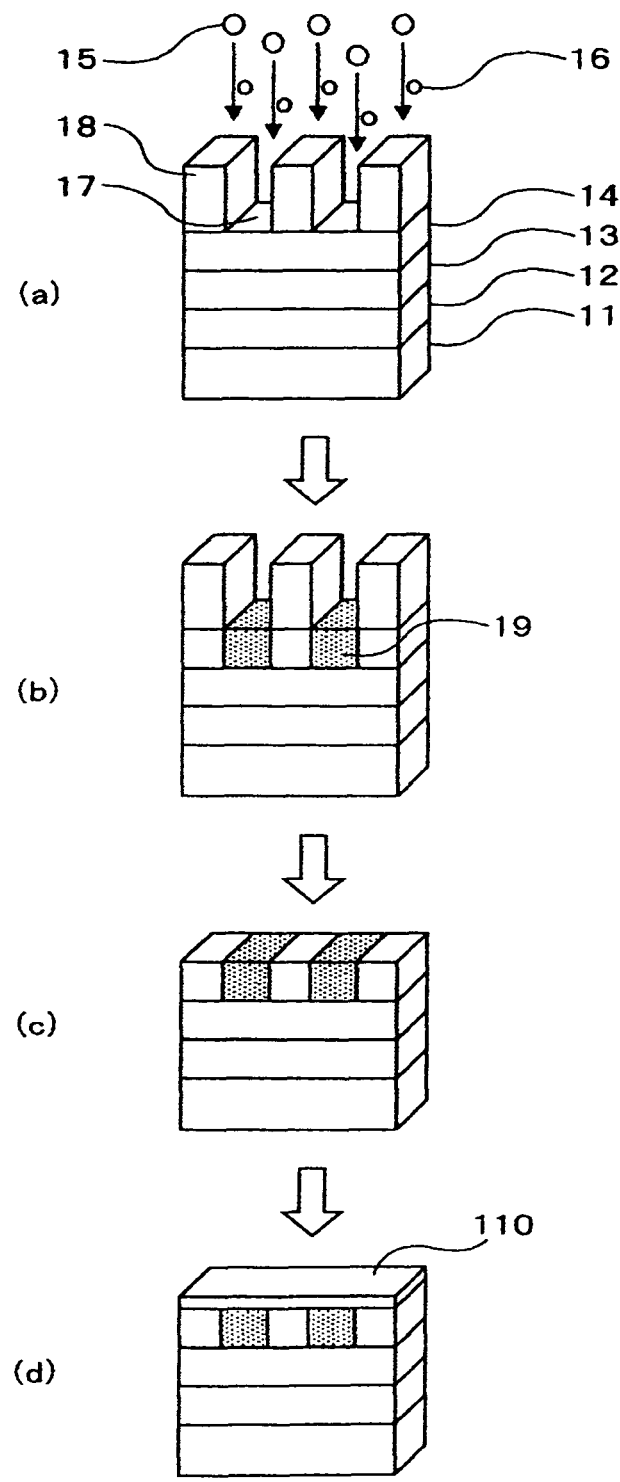
FIGS. 1(a)-1(d) are diagrams of a production process for a magnetic recording medium according to Example 1 of one embodiment of the present invention.

FIGS. 1(a)-1(d) are diagrams of a production process of a magnetic recording medium according to Example 1. In FIG. 1(a), a mask 18 having a required pattern shape was formed on a surface after forming a soft magnetic film 12 of about 30 nm made of an iron-based material to perform assist pass of a magnetic field from a magnetic head, an undercoat film 13 of about 30 nm made of a nickel-based alloy to improve the crystal orientation of a magnetic film 14, the magnetic film 14 of about 20 nm made of a cobalt-based alloy that is to serve as a recording layer, on a glass substrate 11. While an organic polymer-based material that is typically used for a resist can be used as a mask material, the metal thin film mask 18 is used in this example. The reasons for this include prevention of charging with electric charges and reduction of organic particles on the mask surface. The metal thin film mask 18 is patterned concentrically in order to form, for example, a discrete track medium 121 having a diameter of 2.5 inches, as shown in FIG. 12(a). Patterns were prepared that have a masked part 123 with a track width of 40 nm that forms a magnetic part (equivalent to a land in the magnetic film processing method) and an unmasked part 122 with a width of 20 nm, 40 nm, 60 nm and 80 nm that should serve as a non-magnetic part (equivalent to a groove in the magnetic film processing method), as shown in FIGS. 12(b), (c), (d) and (e). In each case, the thickness of the film was about 50 nm. Here, the thickness of the metal thin film 18 is decided in accordance with the ion species and energy of incident ions, and the type of the metal thin film mask 18. That is, the metal thin film mask 18 should have at least a thickness that prevents incident ions from reaching the substrate surface to be processed. However, on the other hand, it is a matter of course that a thinner metal thin film mask 18 is more advantageous to mask pattern transfer.

Then, a plasma beam is irradiated from above this mask 18 and non-magnetization processing is thus carried out, as shown in FIG. 1(a). In this example, as metal ions used for non-magnetization processing, chromium ions are used, which are most effective in reducing magnetization of the cobalt-based alloy to form the magnetic film. This is because electron transition easily occurs because of the close energy levels of d-band of cobalt, and therefore the up-spin band (free band) of the cobalt is efficiently filled. A similar effect can be achieved with vanadium ions or manganese ions, instead of chromium ions. In FIG. 1(a), since the plasma beam is neutral as a whole, electrons 16 and chromium ions 15, especially trivalent and hexavalent chromium ions which are included in the plasma beam, are irradiated onto an unmasked magnetic film surface 17. Therefore, the magnetic film surface 17 is kept electrically neutral and electric charges are not locally accumulated. The chromium ions 15 irradiated onto the magnetic film surface intermittently acquire energy from a high-voltage pulse applied to the substrate 11 and get implanted into the magnetic film 14. The penetration depth of the implanted ions can be freely controlled by the applied voltage. Also, as the electrons 16 intermittently having the opposite phase to the ions are irradiated and provided to the magnetic film 14, again, local accumulation of electric charges does not occur. In this manner, in FIG. 1(b), a non-magnetized area 19 is generated in the magnetic film 14.

Next, in FIG. 1(c), after the plasma beam is irradiated, the metal thin film mask 18 is removed and an oxide film generated on the surface is removed. In FIG. 1(d), a protection film 110 of about 3 nm made of a carbon-based material is formed on the outermost surface.

Next, the details of plasma beam processing in the above process will be described. Plasma beams are generated from arc discharge units 29 arranged to be capable of simultaneously processing both sides of a magnetic disk substrate 24, as shown in FIG. 2. Specifically, a voltage is applied between a cathode 21 and an anode 28 made of chromium and arc discharge 22 is generated in a high-vacuum atmosphere. The cathode 21 is constantly in a high-temperature state as in arc welding and plasma is generated from the cathode surface. The plasma in this case refers to a state where ions 15, considerable portion of which are $Cr^{3+}$ and $Cr^{6+}$, and electrons 16 are generated in vacuum with a gas pressure of $10^{-4}$ Pa or less. Also, an arc current of approximately 100 A is caused to flow into the cathode 21 and arc discharge with an arc voltage of about 20 V is generated. The generated ions 15 and electrons 16 are introduced into a processing chamber 25 that holds the magnetic disk substrate 24, via a magnetic duct 23 curved to carry the plasma while removing droplets generated at the time of arc discharge, and are uniformly irradiated into the magnetic disk substrate 24 by a scanning electromagnet 27. Since the plasma beams are neutral as a whole, electrons 16 and chromium ions 15, especially trivalent and hexavalent chromium ions which are included in the plasma beam, are irradiated. Electric neutrality is maintained even on the outermost surface of the substrate and electric charges are not locally accumulated.

The ions 15 irradiated onto the surface of the magnetic film 14 intermittently acquire energy with a voltage −28 kV applied to the magnetic disk substrate 24 by a high-voltage pulse power supply 26 and at a repetition frequency of 5000 pps, and are implanted into the magnetic film. Here, the penetration depth of the implanted ions is decided by the type and energy of the implanted ions and the relation with the implantation target (here, the magnetic film), that is, nuclear stopping power, and can be freely controlled by the applied energy of the ions. Also, as the electrons 16 intermittently having the opposite phase to the ions are irradiated, provided and injected into the magnetic disk substrate 24; again, local charge accumulation does not occur.

Next, a fluorine-based lubricant was formed to 1 nm on the discrete track medium 121 provided in Example 1 and read-write characteristics were measured by an electromagnetic conversion characteristics evaluating equipment. As measuring conditions, a discrete track medium 121 was set at a rotation speed of 5400 rpm in a test stand, and a tunneling magnetoresistance head was pulled back by 2 nm from the height where the head contacted with magnetic disk surface once. Thus, evaluation was carried out. The tunneling magnetoresistance head used for the measurement had a write head width of 40 nm and a read head width of 35 nm. As measuring points, 10 points from the innermost circle to the outermost circle in the radial direction were selected. As a result, an average track density of about 400 KTPI was provided. This is equivalent to a real track pitch of 60 nm, including a magnetic part width of 40 nm and a non-magnetic part width of 20 nm. The result was substantially coincident with the set value of 423.3 KTPI. Next, in order to carry out depth analysis by a micro-Auger electron spectroscopy with respect to the non-magnetized area, a sample was produced in which only the mask 18 was not formed in the process of FIGS. 1(a)-1(d) for convenience in terms of the measured area (10 micrometers×10 micrometers) and in which non-magnetization was carried out on the whole surface, and evaluation was carried out. The result is shown in FIG. 3. According to this result, it can be understood that chromium ions are implanted with a peak at a thickness of about 10 nm. Also, it can be seen that the average chromium atom percentage in the magnetic film of about 20 nm is about 28 atm %. As will be described later, the area was substantially perfectly non-magnetized at this atom percentage.

As described above, according to the manufacturing method of Example 1, since the surface of the magnetic film irradiated with plasma beams is kept electrically neutral and electric charges are not locally accumulated thereon, a uniform non-magnetic area can be formed over the surface of the magnetic disk substrate. Also, an accurate non-magnetic area according to the mask dimension can be formed. Therefore, a patterned medium suitable for high recording density can be efficiently produced.

Example 2

In the above Example 1, non-magnetization processing is carried out with the mask directly applied to the surface of the magnetic film. However, non-magnetization processing can be carried out even in a state where a protection film is formed on the magnetic film. The reason is that the absolute quantity of ions accumulated in the protection film is small and most of them pass through the protection film because of the relation between the size and energy of implanted ions. FIG. 4 shows a diagram of a production process for such a magnetic recording medium as Example 2. In FIG. 4(a), a metal thin film mask 18 having a required pattern shape is formed on a surface after forming a soft magnetic film 12 of about 30 nm made of an iron-based material, an undercoat film 13 of about 30 nm made of a nickel-based alloy, a magnetic film 14 of about 20 nm made of a cobalt-based alloy, and a protection film 41 of about 3 nm made of a carbon-based material, on a glass substrate 11. The metal thin film mask 18 is patterned concentrically in order to form, for example, a discrete track medium 121 having a diameter of 2.5 inches, as shown in FIG. 12. Patterns were prepared that have a masked part 123 with a track width of 40 nm that forms a magnetic part (equivalent to a land in the magnetic film processing method) and an unmasked part 122 with a width of 20 nm, 40 nm, 60 nm and 80 nm that should serve as a non-magnetic part (equivalent to a groove in the magnetic film processing method). In each case, the thickness of the film was about 50 nm.

The apparatus shown in FIG. 2 as in Example 1 is used for this purpose. Chromium ions 15 are used as metal ions used for non-magnetization processing. In FIG. 4(a), since the plasma beam is neutral as a whole, electrons 16 and chromium ions 15, especially trivalent and hexavalent chromium ions which are included in the plasma beam, are irradiated onto a protection film surface 42. Therefore, even the protection film 41 having high insulating property with a resistivity of 10 e+8 Ωcm or more is kept electrically neutral and electric charges are not locally accumulated. The chromium ions 15 irradiated onto the protection film surface 42 intermittently acquire energy with a voltage −28 kV applied to the substrate and at a repetition frequency of 5000 pps, and are implanted into the magnetic film 14 via the protection film 41. The penetration depth of the implanted ions can be freely controlled by the applied voltage. Also, as the electrons 16 intermittently having the opposite phase to the ions are irradiated, provided and injected, again, local charge accumulation does not occur. In this manner, in FIG. 4(b), a non-magnetized area 43 is generated in the magnetic film 14. However, also in the protection film 41, an area 44 is generated where the chromium ions 15 remain in a small absolute quantity when passing through the film. Next, in FIG. 4(c), after the plasma beam is irradiated, the metal thin film mask 18 was removed.

Next, read-write characteristics of the discrete track medium provided in Example 2 were measured by the same method as in Example 1. As a result of measuring at 10 points picked up from the innermost circle to the outermost circle in the radial direction, an average track density of about 400 KTPI was provided.

In example 2, the area 44 exists where the carbon-based protection film 41 is mixed by the chromium ions 15. However, there were no results having adverse effects on flying characteristics. It is considered that this is because the absolute quantity of chromium remaining in the carbon-based protection film 41 is small.

Next, in order to carry out depth analysis by a micro-Auger electron spectroscopy method with respect to the non-magnetized areas (area 43 and area 44), a sample was produced in which only the mask was not formed in the above process for convenience in terms of the measured area and in which non-magnetization was carried out on the whole surface, and evaluation was carried out. The result is shown in FIG. 5. According to this result, it has been confirmed that the probability of existence of chromium is very low in an area 51 of about 3 nm in the protection film 41, which is the outer surface. Then, it can be understood, as in Example 1, that chromium ions are implanted with a peak at a thickness of about 10 nm. Also, the average chromium atom percentage in the magnetic film of about 20 nm is about 28 atm %. As will be described later, the area was substantially perfectly non-magnetized at this atom percentage.

Also in the manufacturing method according to Example 2, since the protection film surface irradiated with plasma beams is kept electrically neutral and electric charges are not locally accumulated thereon, a uniform non-magnetized area can be formed over the surface of the magnetic film. Also, an accurate non-magnetized area according to the mask dimension can be formed. Therefore, a patterned medium suitable for high recording density can be efficiently produced.

Example 3

In Examples 1 and 2, plasma beams generated by using the arc discharge method are used. However, in Example 3, a manufacturing method is employed in which a plasma beam is generated by supplying electrons with a conventional ion beam method.

A disk substrate used is the same as that of Example 2 and the production process of Example 2 shown in FIG. 4 is followed. That is, a metal thin film mask 18 having a required pattern shape was formed on a surface after forming a soft magnetic film 12 of about 30 nm made of an iron-based material, an undercoat film 13 of about 30 nm made of a nickel-based alloy, a magnetic film 14 of about 20 nm made of a cobalt-based alloy, and a protection film 41 of about 3 nm made of a carbon-based material, on a glass substrate 11. Also the mask pattern was the same as in Example 2.

FIG. 6 shows a schematic diagram of a vacuum processing apparatus for that. That is, chromium ions 15 generated from an ion beam source 61 are caused to flow in, and electrons 16 in an enough quantity to neutralize the generated ion influx are supplied from an electron source 62. These ions and electrons are turned into a plasma beam by using a convergence magnetic field 64 in a feeding chamber 63, then introduced into a processing chamber 25 having a stage to hold a disk substrate 24, and uniformly irradiated onto the disk substrate 24 by a scanning electromagnet 27. Since the plasma beam is neutral as a whole, electrons 16 and chromium ions 15, especially trivalent and hexavalent chromium ions which are included in the plasma beam, are irradiated. Therefore, as shown in the disk substrate process diagram of FIG. 4, even the protection film 41 having high insulating property with a resistivity of 10 e+8 Ωcm or more is kept electrically neutral and electric charges are not locally accumulated. The chromium ions 15 irradiated onto the protection film surface 42 intermittently acquire energy with a voltage −28 kV applied to the disk substrate and at a repetition frequency of 5000 pps, and are implanted into the magnetic film 14 via the protection film 41. The penetration depth of the implanted ions can be freely controlled by the applied voltage. Also, as the electrons 16 intermittently having the opposite phase to the ions are irradiated, provided and injected, again, local charge accumulation does not occur. In this manner, in FIG. 4(b), a non-magnetized area 43 is generated in the magnetic film 14. However, also in the protection film 41, an area 44 is generated where the chromium ions 15 remain in a small absolute quantity when passing through the film. Next, as shown in FIG. 4(c), after the plasma beam is irradiated, the metal thin film mask 18 was removed.

As a result of measuring read-write characteristics of the discrete track medium provided in this Example 3, the results similar to Example 2 were acquired.

Next, comparative evaluation of track density was carried out with respect to a discrete track medium provided by ion implantation using only an ion beam, which is a conventional technique, and a discrete track medium using the plasma beam formed in Example 2.

The disk substrate used had a metal thin film mask 18 formed on a surface after forming a soft magnetic film of about 30 nm made of an iron-based material, an undercoat film of about 30 nm made of a nickel-based alloy, a magnetic film of about 20 nm made of a cobalt-based alloy, and a protection film of about 3 nm made of a carbon-based material, on the same glass substrate. After non-magnetization processing was carried out for each, a fluorine-based lubricant was formed to 1 nm and read-write characteristics were measured by an electromagnetic conversion characteristics evaluating equipment. As measuring conditions, the discrete track medium was set at a rotation speed of 5400 rpm in a test stand, and a tunneling magnetoresistance head was pulled back by 2 nm from the height where the head contacted with magnetic disk surface once. Thus, evaluation was carried out. The tunneling magnetoresistance head used for the measurement had a write head width of 40 nm and a read head width of 35 nm. In the measurement, the average track densities measured at 10 points picked up from the innermost circle to the outermost circle in the radial direction are compared.

FIG. 7 shows the results. In the case where a plasma beam was used, an average track density of about 400 KTPI was provided, whereas in the case where the conventional ion beams was used, an average track density of about 250 KTPI (equivalent to a magnetic part width of 40 nm, a non-magnetic part width of 60 nm and a track pitch of 100 nm) was the maximum. An average track density that is about 1.6 times higher was provided in the case where a plasma beam was used. This is because as a plasma beam simultaneously irradiating ions and electrons is used, which is a characteristic of embodiments of the present invention, the irradiated area is kept electrically neutral with no local accumulation of electric charges and hence local charge-up does not occur. That is, if a plasma beam is used, as shown in the conceptual view of FIG. 8, uniform non-magnetization processing is carried out on the whole surface of the medium and non-magnetization processing is carried out in a form accurately transferred from the mask shape.

On the other band, in the case where the conventional ion beam is used, local charge-up occurs as shown in FIGS. 9(a)-9(c). It is presumed that the difference in track density as shown in FIG. 7 has occurred because of the influence of such local charging. That is, in the case where the conventional ion beam is used, if the width of the non-magnetized area becomes narrower, charge-up gets more conspicuous and it is difficult to form a non-magnetized area with the same depth and the same width on all the tracks of the magnetic disk substrate.

Next, an experiment was conducted on the correlation between the quantity of implantation of chromium ions and the chromium atom percentage in the magnetic film in the above examples. In order to find the chromium atom percentage by depth analysis using the micro-Auger electron spectroscopy, a sample was produced in which only the mask was not prepared in the manufacturing process of Example 2 for convenience in terms of the measured area and in which non-magnetization processing was carried out on the whole surface, and the experiment was thus carried out. Here, a disk substrate having a soft magnetic film of about 30 nm, an undercoat film of about 30 nm, a magnetic film of about 20 nm made of a cobalt-based alloy and a protection film of about 3 nm formed on a glass substrate was used. Then, using the experiment apparatus shown in FIG. 2, the quantity of implantation of the chromium ions 15 into this substrate was changed by changing the implantation time of the chromium ions 15 and the voltage value of the high-voltage pulse power supply source 26 in a range of approximately −5 to −50 kV. Here, at voltage values of 0 to −5 kV, the film deposition effect on the outermost surface is more conspicuous than the ion implantation effect. On the other hand, if a negative voltage exceeding −50 kV is applied, the ion implantation depth exceeds the thickness range of the magnetic film of about 20 nm and reaches the undercoat film and the soft magnetic film, thus deteriorating the magnetic characteristics of the magnetic recording medium itself. Therefore, the voltage value was selected within the foregoing range. Meanwhile, the repetition frequency depends on the specifications of the high-voltage pulse power supply, but a higher repetition frequency causes less damage to the magnetic film. In this experiment, 5000 pps was used as in the other examples.

FIG. 10 shows the relation between plasma beam irradiation time and chromium atom percentage in a sample, where the voltage value of the high-voltage pulse power supply is −28 kV, as an example of the result of this experiment. According to this result, it can be confirmed that the chromium atom percentage in the magnetic film increases along the implantation time.

Next, the correlation between the quantity of implantation of chromium ions and the magnitude of magnetization was examined. In order to measure the magnitude of magnetization by a vibrating sample magnetometer (VSM), an unmasked disk substrate similar to the foregoing sample was used for convenience in terms of the measured area. FIG. 11 shows the result. It has been found that the magnitude of magnetization of the sample, found in the case where the voltage value of the high-voltage pulse power supply is −28 kV and the plasma beam irradiation time is changed, quickly decreases with the increase in the irradiation time and reaches substantially zero at a point of irradiation time 111. If this point 111 is collated with the result of FIG. 10, it has been found that the chromium atom percentage in the magnetic film is equivalent to about 28 atm %.

In each of the above examples, a discrete track medium having a track guide separation area (non-magnetized area) between disk tracks shown in FIG. 12(*a*) is described. However, embodiments of the invention are not limited to this. The manufacturing method according to each of the above examples can also be applied to a bit patterned medium having a separation area (non-magnetized area) in the direction of recording bits, too.

Particular examples have been described above. According to embodiments of the present invention, the track guide separation area and the bit separation area (non-magnetized areas) in a patterned medium represented by a discrete track medium or bit patterned medium suitable for high recording density can be formed uniformly on the whole surface of the magnetic disk substrate and accurately according to the mask. A patterned medium of higher recording density can be efficiently formed.

What is claimed is:

1. A method for manufacturing a magnetic recording medium characterized by including:
   forming a soft magnetic film and an undercoat film on a top part of a substrate;
   forming at least a magnetic film and a protection film above the undercoat film;
   forming, on the protection film, a mask having a pattern to form a non-magnetic area in the magnetic film;
   irradiating the protection film having the mask formed thereon with ions and electrons and applying an intermittent voltage to the substrate, thereby non-magnetizing an area of the magnetic film irradiated with ions and electrons via the protection film; and
   removing the mask.

2. The method for manufacturing a magnetic recording medium according to claim 1, characterized in that a plasma beam is used to irradiate the magnetic film with ions and electrons.

3. The method for manufacturing a magnetic recording medium according to claim 1, characterized in that in order to irradiate the magnetic film with ions and electrons, plasma is generated by arc discharge of a negative electrode having metal as its principal component, and the generated plasma is carried by a curved magnetic duct and thus supplied to the substrate.

4. The method for manufacturing a magnetic recording medium according to claim 1, characterized in that an ion beam source and an electron supply source are simultaneously used to irradiate the magnetic film with ions and electrons.

5. The method for manufacturing a magnetic recording medium according to claim 1, characterized in that a high-voltage pulse power supply capable of outputting at least about 5 kV in absolute terms is used to apply an intermittent voltage to the substrate.

6. The method for manufacturing a magnetic recording medium according to claim 5, characterized in that an output voltage of the high-voltage pulse power supply is adjusted to −5 to −50 kV, thereby adjusting depth of the non-magnetized area formed in the magnetic film.

7. The method for manufacturing a magnetic recording medium according to claim 1, characterized in that the ions are chromium ions, manganese ions or vanadium ions.

8. The method for manufacturing a magnetic recording medium according to claim 1, characterized in that the mask is a metal thin film.

9. The method for manufacturing a magnetic recording medium according to claim 1, characterized in that the undercoat film comprises a nickel-based alloy and the soft magnetic film comprises an iron-based alloy.

* * * * *